(12) United States Patent
Marais

(10) Patent No.: US 7,348,911 B2
(45) Date of Patent: Mar. 25, 2008

(54) COMMON MODE MANAGEMENT BETWEEN A CURRENT-STEERING DAC AND TRANSCONDUCTANCE FILTER IN A TRANSMISSION SYSTEM

(75) Inventor: Emmanuel Marais, Peypin (FR)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 11/500,655

(22) Filed: Aug. 8, 2006

(65) Prior Publication Data

US 2008/0036634 A1    Feb. 14, 2008

(51) Int. Cl.
    *H03M 1/66* (2006.01)
(52) U.S. Cl. .................. 341/144; 330/260; 327/561
(58) Field of Classification Search ............ 341/144; 327/543, 561; 360/66; 330/9, 260
    See application file for complete search history.

(56) References Cited

U.S. PATENT DOCUMENTS

| | | | |
|---|---|---|---|
| 5,530,399 A * | 6/1996 | Chambers et al. | 327/561 |
| 5,585,802 A | 12/1996 | Cabler et al. | |
| 5,812,020 A * | 9/1998 | Raghavan et al. | 327/543 |
| 6,545,622 B1 | 4/2003 | Kamal et al. | |
| 6,590,516 B2 * | 7/2003 | Inagaki et al. | 341/144 |
| 6,600,373 B1 * | 7/2003 | Bailey et al. | 330/260 |
| 6,741,195 B1 | 5/2004 | Cho | |
| 7,002,403 B2 * | 2/2006 | Marholev | 327/552 |
| 2003/0112543 A1 * | 6/2003 | Ohlson | 360/66 |
| 2003/0189461 A1 * | 10/2003 | Huijsing et al. | 330/9 |
| 2005/0057280 A1 | 3/2005 | Groen et al. | |
| 2006/0006901 A1 | 1/2006 | Groen et al. | |
| 2006/0071834 A1 | 4/2006 | del mar Charmarro Marti et al. | |

OTHER PUBLICATIONS

Andreani, Pietro, "On the Use of Nauta's Transconductor in Low-Frequency CMOS $g_m$–C Bandpass Filters," IEEE Journal of Solid-State Circuits, vol. 37, No. 2, Feb. 2002, pp. 114-124.
Nauta, Bram, "A CMOS Transconductance-C Filter Technique for Very High Frequencies," IEEE Journal of Solid-State Circuits, vol. 27, No. 2, Feb. 1992, pp. 142-153.
Beek, Van P.C.W. et al., "Optimum Segmentation for High Speed Current Steering Digital-to-Analog Converters," Phillips Research Laboratories, The Netherlands, pp. 465-473, no date.
Zeijl Van T.M., Paul et al., "A Bluetooth Radio in 0.18 μm CMOS," IEEE International Solid-State Circuits Conference, Feb. 4, 2002, 3 pages.

* cited by examiner

*Primary Examiner*—Jean B Jeanglaude
(74) *Attorney, Agent, or Firm*—Sawyer Law Group LLP

(57) ABSTRACT

Common mode management between a DAC, such as a current-steering DAC, and a transconductance filter in a high-frequency transmission system. In one aspect of the invention, a transmission circuit includes a DAC that provides an analog signal from an input digital signal, and a filter such as a transconductance filter connected to the DAC, the filter receiving the analog signal and filtering the analog signal for transmission. A common mode management circuit connected to the DAC and the transconductance filter provides common mode compatibility in the interface connecting the DAC and the transconductance filter.

25 Claims, 4 Drawing Sheets

COMMON MODE MANAGEMENT BETWEEN A CURRENT-STEERING DAC AND TRANSCONDUCTANCE FILTER IN A TRANSMISSION SYSTEM

FIELD OF THE INVENTION

The present invention relates to transmission systems for transmitting high frequency signals, and more particularly to a digital-to-analog converter and filter in a transmission system.

BACKGROUND OF THE INVENTION

In communication applications such as high frequency transmission and reception, including radio frequency (RF) transmission, several electronic components are used. For example, in a classical transmission system or chain, digital modulated inputs are converted into the analog domain to be transmitted through the atmosphere. FIG. 1 shows one example of a transmission chain 10, in which a digital signal 12 is received by a digital modulator 14, which converts the information in the digital signal into a digital continuous-time waveform for transmission. A digital-to-analog converter (DAC) 16 receives the output of the digital modulator 14, and converts the digital waveform into an equivalent analog waveform. A filter 18 receives the analog waveform and filters spurious frequencies that are introduced in the conversion process used by the DAC, since this process is not a perfect one. For example, a transconductance filter is commonly used for filter 18. The filtered analog waveform is then received by an RF block 20, which includes a mixer for ensuring a conversion into the RF domain and a power amplifier for driving a connected antenna 22, and is able to transmit the analog waveform into the atmosphere using the connected antenna 22 or similar mechanism. This type of transmission chain can be used with various different standards, including IEEE 802.11, Bluetooth, Global System for Mobile Communications (GSM), and other standards.

The interfacing between the DAC 16 and the filter 18 is a critical issue in the transmission chain 10, since a poor compatibility between these components can induce distortions in the transmitted signal and cause the signal to disrespect the output spectral masks imposed by a particular standard.

One common configuration for these components in the transmission chain 10 is to use a current-steering DAC for DAC 16, and a transconductance filter for filter 18, specifically a transconductance-C (Gm-C) filter built with Nauta's transconductance. Such a configuration allows several advantages, including low cost, low-power operation and linearity. Nauta's transconductance is often used in a transmission chain as well as reception chains, and offers advantages of low supply voltage, internal common mode regulation, and no internal nodes, such that no compensation capacitor is required.

An example of a typical current-steering DAC 50 is shown in FIG. 2, shown in a single-ended configuration. The DAC 50 is generally used in a differential configuration, and thus a second DAC component would be provided for the differential layout. DAC 50 includes a digital input 52 from the digital modulator 14 that provides a digital signal to the DAC 50. Input 52 is connected to unit current sources 54, where a number of the current sources 54 are turned on based on the received digital code at input 52, and where N is the number of bits at the digital input 52. The currents from the current sources 54 are summed to provide an output current proportional to the digital input 52, as is well known in DAC operation. The analog output voltage from current sources 54 is generated at branches of a resistive load RL which is connected to a reference voltage of the DAC called VREF_IDAC. The analog output voltage $V_{IP}$ can be expressed as shown in equation (1):

$$V_{IP} = \text{VREF\_IDAC} - n \cdot I_u \cdot RL \quad (1)$$

where Iu is the unit current source and n is the number of unit current sources turned on. The number n can generally be any number between zero and $(2^N-1)$.

FIG. 3 is a schematic illustration of an example of a typical transconductor 70 of the transconductance filter 18. Transconductor 70 is a Nauta's type of transconductor, and includes two differential input terminals INP and INN. Each input is connected to an inverter 72, where each inverter 72 has a supply control voltage VCTRL. Additional inverters 74 are coupled between the input terminals as shown, and also receive the supply control voltage VCTRL. The transistors of the inverters 72 and 74 are CMOS n and p transistors. Two output terminals OUTN and OUTP are provided as the differential output of the transconductor 70.

The transconductance value (gmd) of transconductor 70 depends on the supply voltage VCTRL and on process parameters, as shown in equation (2):

$$gmd = (VCTRL - Vtn + Vtp)\sqrt{\beta_n \beta_p} \quad (2)$$

where Vtn and Vtp are the threshold voltages of the n and p CMOS transistors of the transconductor 70, VCTRL is the voltage supply of the transconductor and the Gm-C filter 18, and $$\beta_{n/p} = \mu_{n/p} Cox \frac{W}{L}.$$

FIG. 4 is a block diagram illustrating the Gm-C filter 18. Since the Nauta's transconductance value of the transconductor 70 depends on the supply voltage VCTRL, VCTRL is the tuning voltage of the filter 18. A frequency automatic tuning block 80 automatically tunes the VCTRL supply for the filter 18. For example, a standard phase locked loop can control the frequency automatic tuning, so that the VCTRL supply moves in such a way that the cutoff frequency of the filter 18 is provided at a desired frequency rather than a frequency influenced by the process variations of the circuits (i.e., so that the cutoff frequency is process independent). The transconductor 70 is shown as a schematic symbol provided within the filter 18. The filter 18 receives $V_{IP}$ and $V_{IN}$ input signals, and provides IPFILT and INFILT filtered output signals.

FIG. 5 is a block diagram illustrating a circuit 90 including the DAC 92, transconductance filter 18, and the connection of the DAC 92 to the filter 18. The two differential components 50a and 50b of the DAC 92 are connected to the $V_{IP}$ and $V_{IN}$ inputs of the filter 18, respectively. The outputs IPFILT and INFILT of the filter 18 are provided to the RF block 20 as shown in FIG. 1.

One problem with the prior transmission chains that use a current-steering DAC and a transconductance-C filter is that the interfacing between the DAC and the filter is not optimal. The common mode compatibility between these components is typically poor, which induces distortions and noise in the transmitted signal and causes the signal to disrespect the output spectral masks imposed by a particular communication standard. This can also lead to sub-optimal linearity and power consumption in the transmission system performance.

Accordingly, improved common mode management between a current-steering DAC and a transconductance filter in an RF transmitter would reduce distortion in transmitted signals.

SUMMARY OF THE INVENTION

The invention of the present application relates to common mode management in a transmission system, such as between a current-steering DAC and a transconductance filter in a high-frequency transmission system. In one aspect of the invention, a transmission circuit includes a current-steering DAC that provides an analog signal from an input digital signal, and a transconductance filter connected to the current-steering DAC, the transconductance filter receiving the analog signal and filtering the analog signal for transmission. A common mode management circuit connected to the current-steering DAC and the transconductance filter provides common mode compatibility in the interface connecting the current-steering DAC and the transconductance filter.

In another aspect of the invention, a transmission circuit includes a current-steering DAC that provides a differential analog signal from an input digital signal, and a transconductance filter that receives the differential analog signal and filters the differential analog signal for RF transmission, where a control voltage supplied to the transconductance filter is a tuning voltage auto-tuned with a frequency automatic tuning block connected to the transconductance filter. A reference voltage generation circuit connected to the current-steering DAC and the transconductance filter provides common mode compatibility in the interface connecting the DAC and the transconductance filter by generating a reference voltage for the DAC from the control voltage supplied to the transconductance filter.

In another aspect of the invention, a method for reducing distortion in a transmission circuit includes providing a common mode management circuit connected to a current-steering DAC and to a transconductance filter, where the current-steering DAC provides an analog signal to the transconductance filter that filters the analog signal for transmission. Common mode compatibility is provided in the interface connecting the current-steering DAC and the transconductance filter by matching an output common mode voltage of the current-steering DAC to an input common mode voltage of the transconductance filter.

In another aspect of the invention, a transmission circuit includes a DAC that provides an analog signal from an input digital signal, and a filter connected to the DAC, the filter receiving the analog signal and filtering the analog signal for transmission. A common mode management circuit connected to the DAC and the filter provides common mode compatibility in the interface connecting the DAC and the filter.

The present invention provides an interface between a DAC, such as a current-steering DAC, and a filter, such as a transconductance filter, in a transmission system. The interface can significantly reduce the distortion normally caused by poor common mode compatibility between the DAC and filter. The present invention can thus reduce the power consumption and increase the linearity of transmitter operation.

DETAILED DESCRIPTION

The present invention relates to transmission systems for transmitting high frequency signals, and more particularly to a digital-to-analog converter and filter in a transmission system. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

The present invention is mainly described in terms of particular circuits provided in particular implementations. However, one of ordinary skill in the art will readily recognize that this circuit will operate effectively in other implementations.

To more particularly describe the features of the present invention, please refer to FIGS. 6 and 7 in conjunction with the discussion below.

Figure 6:
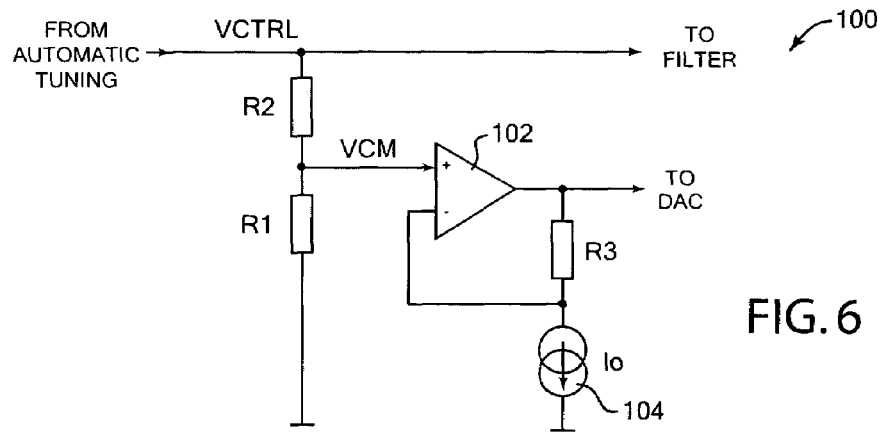
FIG. 6 is a schematic view of a reference voltage generation circuit of the present invention for use with a current-steering DAC and a transconductance filter of a transmission system.

FIG. 6 is a schematic view of a reference voltage generation circuit 100 of the present invention for use with a current-steering DAC and a transconductance filter of a transmission system. The voltage generation circuit 100 is connected to the reference voltage supplies of a current-steering DAC and a transconductance filter, as described in greater detail below with reference to FIG. 7.

Figure 3:
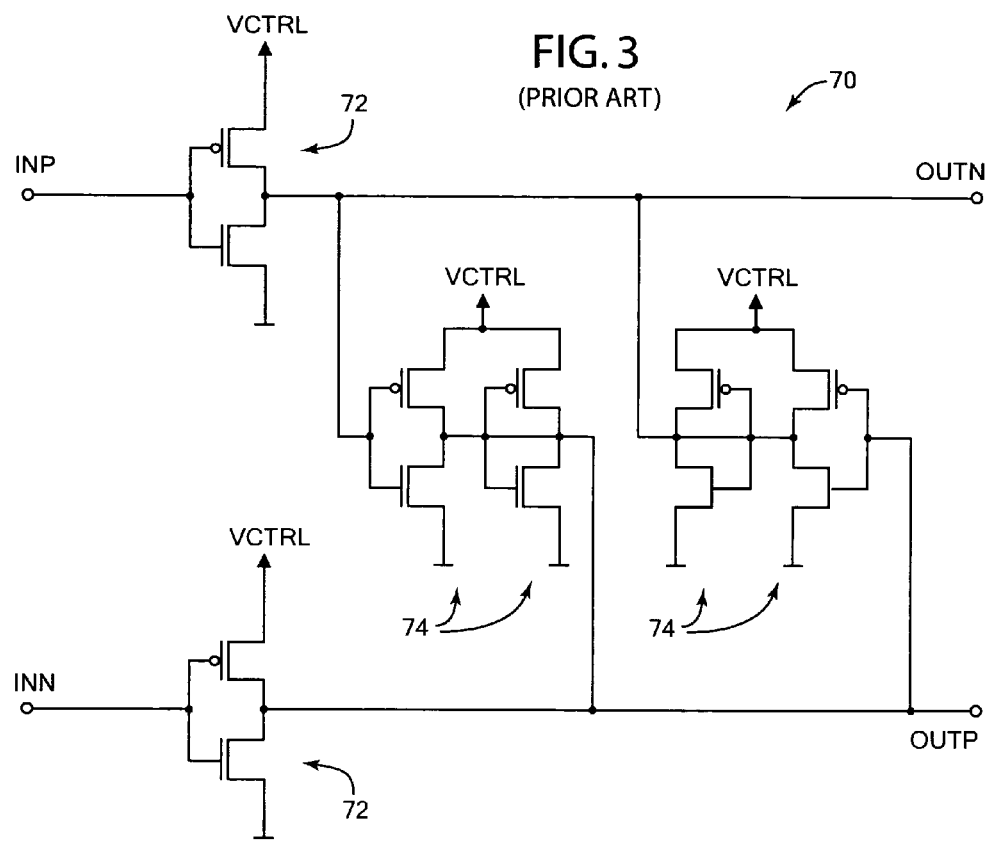
FIG. 3 is a schematic view of a transconductor using Nauta's transconductance, suitable for use with the present invention.
Figure 4:
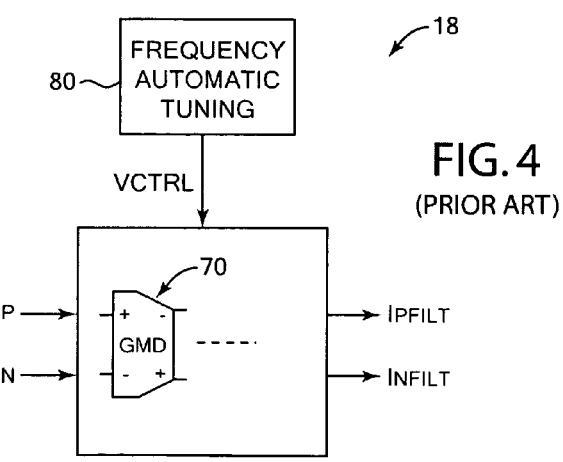
FIG. 4 is a block diagram of a transconductance filter suitable for use with the present invention.
Figure 5:
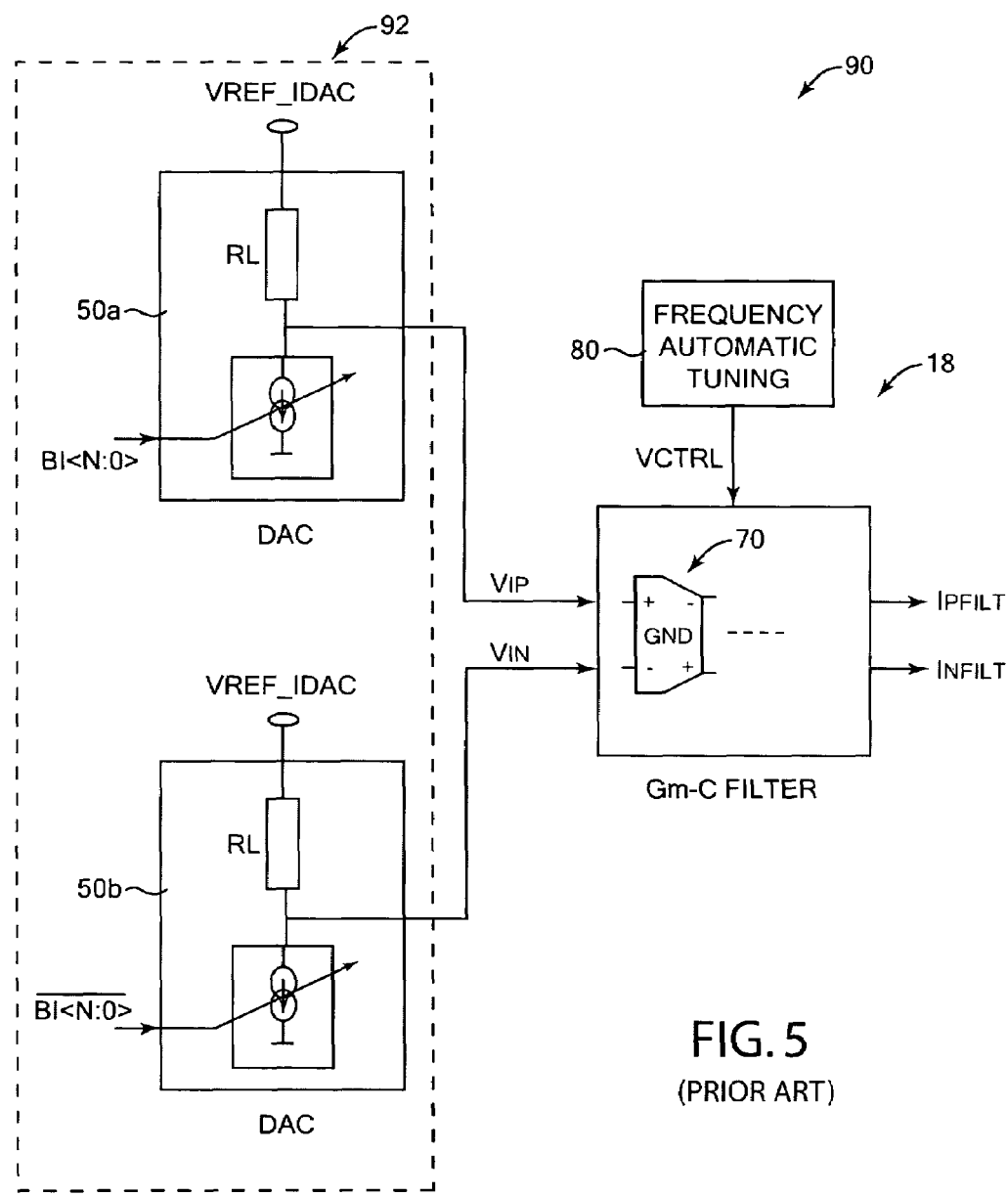
FIG. 5 is a block diagram illustrating the DAC, transconductance filter, and the connection of the DAC with the filter.

To obtain maximum input range and maximum linearity in a transmission system having a transconductance filter, all the inverters of the Nauta's transconductance in the Gm-C filter are dimensioned in such a manner that their threshold voltage (common mode voltage) can be expressed as shown in equation (3):

$$vcm_{\text{Nauta\_inv}} = \frac{VCTRL}{2} \qquad (3)$$

where $vcm_{Nauta\_inv}$ is the common mode voltage and VCTRL is the supply voltage for the transconductor. This common mode voltage is the best suitable input common mode voltage of a transconductance filter having a transconductor 70 as shown in FIG. 3, and corresponds (approximately) to the middle of the gain zone of the inverters of the transconductor. From equation (3), this common mode voltage is linked to the VCTRL voltage, and thus is linked to the process variations of the circuit components.

An improvement provided by the present invention is to adapt the output common mode voltage of the DAC to the common mode voltage of the transconductor, as shown in equation (4):

$$vcm_{ip} = vcm_{in} = vcm_{Naut\_inv} \quad (4)$$

where $vcm_{ip}$ and $vcm_{in}$ are the common mode voltages output by the current-steering DAC (single-ended voltages) and appearing at the input terminals INP and INN of the transconductor as shown in FIG. 3.

If equation (3) is not satisfied, the inverters of the transconductance filter will not operate in saturation and distortion will occur on the signal to be transmitted from the transmission system, causing sub-optimal performance of the transmission system.

The present invention reduces or removes this distortion by satisfying equation (3). This is accomplished by generating the reference voltage VREF_IDAC of the current-steering DAC from the transconductance tuning voltage VCTRL.

FIG. 6 shows one example of a circuit 100 that performs this function. In circuit 100, the VCTRL supply voltage for the transconductance filter 18 is connected to a resistor bridge in addition to being connected to the transconductance filter. The resistor bridge includes resistors R1 and R2, where R2 is connected to the VCTRL voltage, and R1 is connected between R2 and ground. A voltage vcm results from this arrangement at the connection between the resistors R1 and R2 (a voltage divider). The vcm voltage is provided to the positive input of an operational amplifier 102. The output of the operational amplifier 102 is provided as the reference voltage VREF_IDAC to the current steering DAC (see FIG. 7). A resistor R3 is also connected to the output of the operational amplifier 102, and a current source 104 providing a current $I_o$ is connected between the resistor R3 and ground. The node between the resistor R3 and the current source 104 is fed back to the negative input of the operational amplifier 102.

The output of the operational amplifier 102, VREF_IDAC, thus can be shown as equation (5), based on the circuit of FIG. 6:

$$VREF\_IDAC = vcm + R3 \cdot I_o = \frac{R1}{R1+R2} VCTRL + R3 \cdot I_o \quad (5)$$

The output voltage of the current-steering DAC can be shown as equation (6):

$$vcm_{ip} = \quad (6)$$
$$VREF\_IDAC - \frac{(2^N - 1) \cdot I_u \cdot R_L}{2} \approx VREF\_IDAC - 2^{N-1} \cdot I_u \cdot R_L$$

where N is the number of bits in the DAC, $I_u$ is the current of the unit current sources in the DAC, and $R_L$ is the load resistance of the DAC. Equation (6) is based on the output DAC voltage equation (1), with the number of unit current sources (n) being the maximum number of such current sources ($2^N - 1$, where N is the number of bits) and this term being divided by two since a common mode voltage is being determined.

From equations (3), (4), and (6), equation (7) is obtained:

$$VREF\_IDAC = \frac{VCTRL}{2} + 2^{N-1} \cdot I_u \cdot R_L \quad (7)$$

As noted above, a goal of the present invention is to satisfy the condition $vcm_{Nauta\_inv} = vcm_{ip} = vcm_{in}$. This condition is satisfied if equation (8) is used:

$$\frac{VCTRL}{2} + 2^{N-1} \cdot I_u \cdot R_L = \frac{R1}{R1+R2} VCTRL + R3 \cdot I_o \quad (8)$$

The actual values used in equation (8) can be determined as appropriate. For example, if the following equations (9) and (10) are used:

$$R1 = R2 \quad (9)$$

$$R3 = \frac{2^{N-1} \cdot R_L I_u}{I_o} \quad (10)$$

then equation (8) is satisfied, and the output voltages of the current-steering DAC have an adjusted common mode voltage that will perfectly match to the best suitable input common mode voltage of the transconductance filter (VCTRL/2). Thus, no distortion will occur in the transmitted signal caused by poor common mode compatibility between the current-steering DAC and the transconductance filter.

Figure 1:
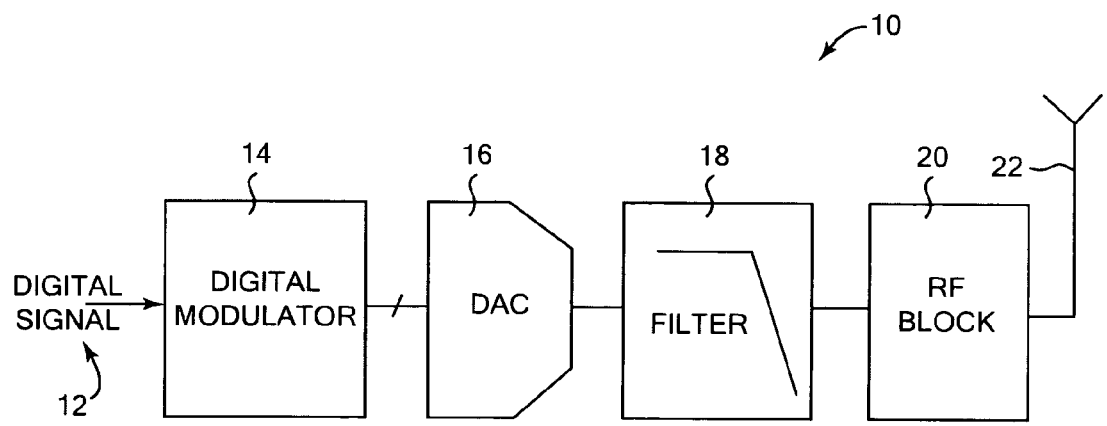
FIG. 1 is a block diagram of a transmission chain of components suitable for use with the present invention.
Figure 2:
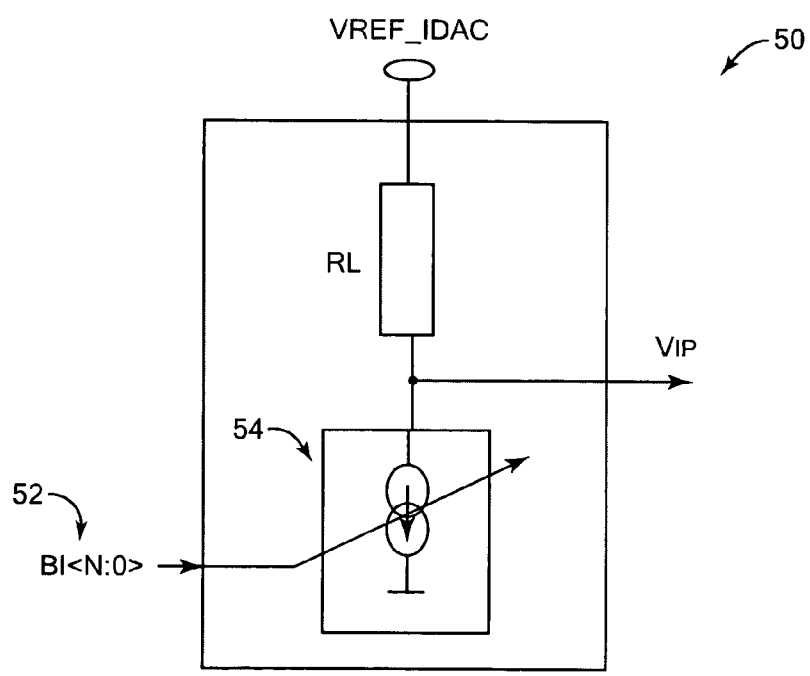
FIG. 2 is a schematic view of a current-steering DAC suitable for use with the present invention.
Figure 7:
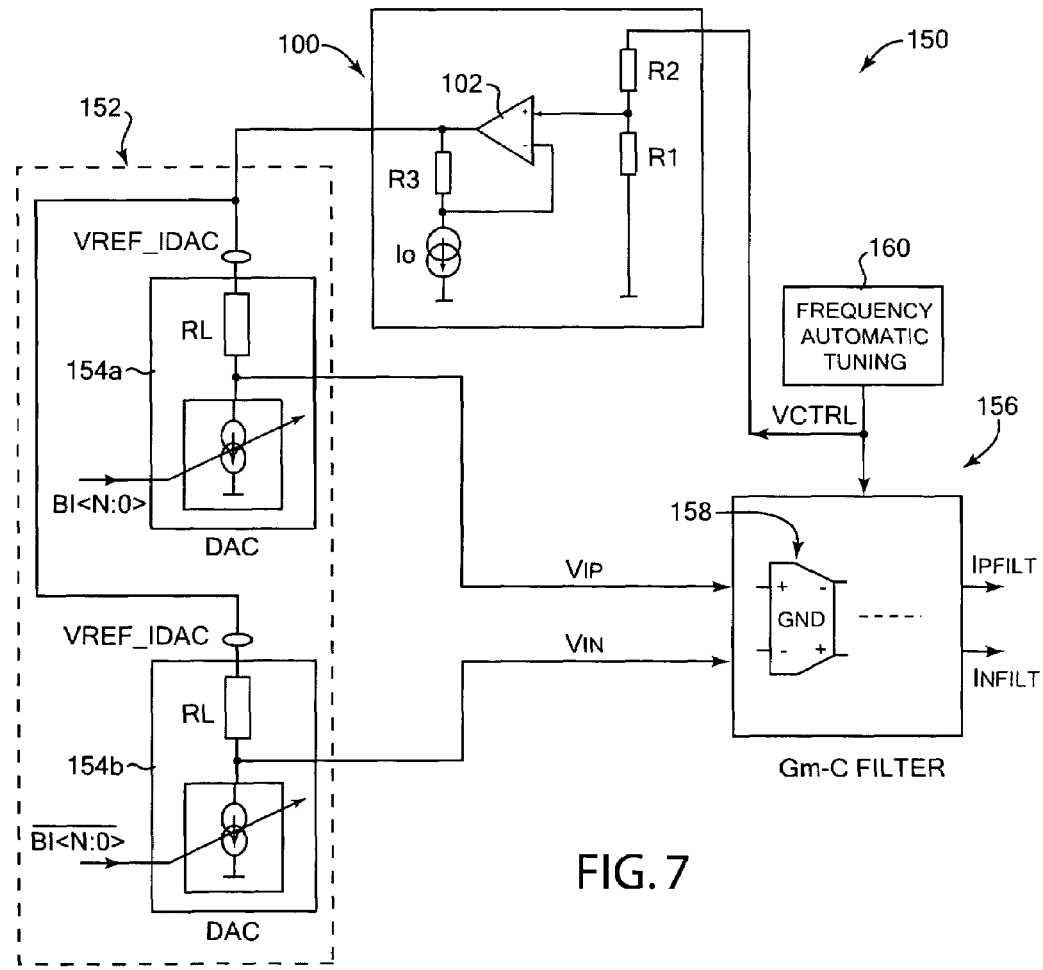
FIG. 7 is a schematic view of a circuit including a differential current-steering DAC, transconductance filter, and the reference voltage generation circuit of the present invention.

FIG. 7 is a schematic illustration of a circuit 150 including a differential current-steering DAC 152, transconductance filter 156, and a common mode circuit. In this example, the common mode circuit is or includes the reference voltage generation circuit 100 of the present invention as described with reference to FIG. 6. The differential outputs $V_{IP}$ and $V_{IN}$ of the DAC 152 are each provided from a single-ended DAC 154a and 154b, respectively, where each single-ended DAC 154 outputs an analog voltage waveform based on a digital waveform as explained above with reference to FIG. 2.

The differential outputs $V_{IP}$ and $V_{IN}$ are connected to the transconductance filter 156 at the input terminals IPN and INN and the filter 156 uses Nauta's transconductor 158 similar to the transconductor 70 as described above with reference to FIG. 3. Frequency automatic tuning block 160 provides the VCTRL supply voltage for the transconductance filter 156. Other components can be used instead of current-steering DAC 152 or transconductance filter 156 which have similar functionality and controllability as these components.

The circuit 100 of the present invention also receives the VCTRL signal from the frequency automatic tuning block 160 at the resistor R2 and provides the voltage at the output of the operational amplifier 102 as the VREF_IDAC reference voltage to each of the single-ended DACs 154a and 154b. The VREF_IDAC reference voltage has been adjusted by the circuit 100 to provide common mode compatibility between DAC 152 and transconductor 158, thereby providing little or no distortion in the interface between DAC 152 and filter 156.

In other embodiments, other relations can be used for equations (9) and (10) which provide the desired common mode compatibility. In addition, circuits different than circuit 100 can be used in other embodiments to provide the desired equal relation between the common mode voltage output of a DAC and the best suitable common mode voltage input of a filter in a high frequency transmission system.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A transmission circuit comprising:
   a current-steering DAC that provides an analog signal from an input digital signal;
   a transconductance filter connected to the current-steering DAC, the transconductance filter receiving the analog signal and filtering the analog signal for transmission; and
   a common mode circuit connected to the current-steering DAC and the transconductance filter that provides a reference signal to the current-steering DAC to provide common mode compatibility between the current-steering DAC and the transconductance filter.

2. The transmission circuit of claim 1 wherein the transconductance filter includes Nauta's transconductor.

3. The transmission circuit of claim 1 wherein the common mode compatibility includes causing a common mode voltage output from the current-steering DAC to match an input common mode voltage of the transconductance filter at a transmission signal input of the transconductance filter.

4. The transmission circuit of claim 3 wherein the input common mode voltage of the transconductance filter includes a common mode voltage of inverters of a transconductor of the transconductance filter, the common mode voltage of the inverters providing a maximum input range and linearity for the performance of the transconductor.

5. The transmission circuit of claim 3 wherein the common mode circuit includes a reference voltage generation circuit that generates the reference signal as a reference voltage input to the current-steering DAC based on a control voltage, the control voltage being input to the reference voltage generation circuit and supplied to the transconductance filter to tune the transconductance filter.

6. The transmission circuit of claim 5 wherein the control voltage supplied to the transconductance filter is a tuning voltage auto-tuned with a frequency automatic tuning block to provide desired filter operation, wherein based on the control voltage, the reference voltage adjusts to cause the current-steering DAC to output the best suitable input common mode voltage for the transconductance filter.

7. The transmission circuit of claim 5 wherein the input common mode voltage of the transconductance filter is the control voltage divided in half, corresponding approximately to the middle of the gain zone of inverters of the transconductor.

8. The transmission circuit of claim 7 wherein the common mode circuit includes a resistor bridge coupled to the control voltage.

9. The transmission circuit of claim 8 wherein the common mode circuit includes an operational amplifier receiving a divided voltage from the resistor bridge, the operational amplifier having as its output the reference voltage for the current-steering DAC.

10. The transmission circuit of claim 3 wherein the current steering DAC is a differential DAC providing a differential input signal to the transconductance filter.

11. A transmission circuit comprising:
    a current-steering DAC that provides a differential analog signal from an input digital signal;
    a transconductance filter that receives the differential analog signal and filters the differential analog signal for RF transmission, wherein a control voltage supplied to the transconductance filter is a tuning voltage auto-tuned with a frequency automatic tuning block connected to the transconductance filter; and
    a reference voltage generation circuit connected to the current-steering DAC and the transconductance filter that provides common mode compatibility between the current-steering DAC and the transconductance filter by generating a reference voltage input to the current-steering DAC based on the control voltage supplied to the transconductance filter.

12. The transmission circuit of claim 11 wherein the transconductance filter includes Nauta's transconductor, and wherein the common mode compatibility includes a match of the output common mode voltage of the current-steering DAC to an input common mode voltage of the transconductance filter at a transmission signal input of the transconductance filter.

13. The transmission circuit of claim 12 wherein the input common mode voltage of the transconductance filter is the control voltage divided in half, corresponding to approximately the middle of the gain zone of inverters of the transconductor.

14. The transmission circuit of claim 11 wherein the reference voltage generation circuit includes a resistor bridge coupled to the control voltage and an operational amplifier receiving a divided voltage from the resistor bridge, the operational amplifier having as its output the reference voltage for the current-steering DAC.

15. A method for reducing distortion in a transmission circuit, comprising:
    providing a common mode circuit connected to a current-steering DAC and to a transconductance filter, wherein the current-steering DAC provides an analog signal to the transconductance filter that filters the analog signal for transmission; and
    providing common mode compatibility between the current-steering DAC and the transconductance filter by matching an output common mode voltage of the current-steering DAC to an input common mode voltage of the transconductance filter at a transmission signal input of the transconductance filter.

16. The method of claim 15 wherein the common mode circuit includes a reference voltage generation circuit that generates a reference voltage input to the current-steering DAC based on a control voltage, the control voltage being input to the reference voltage generation circuit and supplied to the transconductance filter to tune the transconductance filter.

17. The method of claim 15 wherein the transconductance filter includes Nauta's transconductor.

18. The method of claim 15 wherein the input common mode voltage of the transconductance filter includes a common mode voltage of inverters of a transconductor of the transconductance filter, the common mode voltage of the inverters providing a maximum input range and linearity for the performance of the transconductor.

19. The method of claim 15 wherein providing the common mode compatibility includes providing the common mode voltage of inverters of the transconductor as the control voltage divided in half, corresponding approximately to the middle of the gain zone of the inverters.

20. The method of claim 16 wherein the control voltage supplied to the transconductance filter is a tuning voltage auto-tuned by a frequency automatic tuning block to provide desired filter operation, wherein based on the control voltage, the reference voltage adjusts to cause the current-steering DAC to output the best suitable common mode voltage for the transconductance filter.

21. A transmission circuit comprising:
a DAC that provides an analog signal from an input digital signal;
a filter connected to the DAC, the filter receiving the analog signal and filtering the analog signal for transmission; and
a common mode circuit connected to the DAC and the filter that provides a reference signal to the current-steering DAC to provide common mode compatibility between the DAC and the filter.

22. The transmission circuit of claim 21 wherein the filter includes Nauta's transconductor.

23. The transmission circuit of claim 21 wherein the common mode compatibility includes causing a common mode voltage output from the DAC to match a desired input common mode voltage of the filter at a transmission signal input of the transconductance filter.

24. The transmission circuit of claim 23 wherein the common mode circuit includes a reference voltage generation circuit that generates the reference signal as a reference voltage input to the DAC based on a control voltage, the control voltage being input to the reference voltage generation circuit and supplied to the filter to tune the filter.

25. The transmission circuit of claim 24 wherein the control voltage supplied to the filter is a tuning voltage auto-tuned to provide desired filter operation, wherein based on the control voltage, the reference voltage adjusts to cause the DAC to output a common mode voltage matched to a desired input common mode voltage of the filter.

* * * * *

UNITED STATES PATENT AND TRADEMARK OFFICE
CERTIFICATE OF CORRECTION

PATENT NO. : 7,348,911 B2
APPLICATION NO. : 11/500655
DATED : March 25, 2008
INVENTOR(S) : Marais Page 1 of 1

It is certified that error appears in the above-identified patent and that said Letters Patent is hereby corrected as shown below:

On the Title page, Item (56), under "U.S. Patent Documents", line 5, delete "mar" and insert -- Mar --, therefor.

In column 2, line 10, delete "Iu" and insert -- $I_u$ --, therefor.

In column 5, line 13, delete "$vcm_{ip}=vcm_{in}=vcm_{Naut\_inv}$" and insert -- $vcm_{ip}=vcm_{in}=vcm_{Nauta\_inv}$ --, therefor.

Signed and Sealed this

Fourteenth Day of October, 2008

JON W. DUDAS
*Director of the United States Patent and Trademark Office*